US011025096B2

(12) United States Patent
Vilenskiy et al.

(10) Patent No.: US 11,025,096 B2
(45) Date of Patent: Jun. 1, 2021

(54) MICROWAVE WIRELESS CHARGER WITH FOCUSING OF MICROWAVE FIELD

(71) Applicant: Samsung Electronics Co., Ltd., Suwon-si (KR)

(72) Inventors: Artem Rudolfovitch Vilenskiy, Moscow (RU); Mikhail Nikolaevich Makurin, Arkhangelsk (RU); Sung-Bum Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/006,605

(22) Filed: Aug. 28, 2020

(65) Prior Publication Data

US 2020/0395790 A1    Dec. 17, 2020

Related U.S. Application Data

(63) Continuation of application No. 15/833,957, filed on Dec. 6, 2017, now Pat. No. 10,763,704.

(30) Foreign Application Priority Data

Dec. 14, 2016    (RU) ........................... RU2016149071

(51) Int. Cl.
    *H01M 10/44*    (2006.01)
    *H01M 10/46*    (2006.01)
    (Continued)

(52) U.S. Cl.
    CPC .............. *H02J 50/23* (2016.02); *H01Q 1/50* (2013.01); *H01Q 3/2605* (2013.01); *H01Q 3/28* (2013.01);
    (Continued)

(58) Field of Classification Search
    CPC .. H02J 50/15; H02J 50/20; H02J 50/23; H02J 50/40; H02J 50/27; H02J 7/025;
    (Continued)

(56) References Cited

U.S. PATENT DOCUMENTS 5,043,738 A      8/1991  Shapiro et al.
5,400,037 A  *   3/1995  East ........................ H02J 50/40
                                                         342/372
(Continued)

FOREIGN PATENT DOCUMENTS

CN        203660055 U    6/2014
CN        204695082 U    10/2015
(Continued)

OTHER PUBLICATIONS

Search Report dated Nov. 16, 2017 in connection with Russian Application No. 2016149071, 2 pages.
(Continued)

*Primary Examiner* — Edward Tso

(57) ABSTRACT

Disclosed is an apparatus and method for wirelessly transmitting power to power receivers from a power transmitter. The present disclosure provides a rational search procedure for locations of the power receivers, and provides a function of simultaneously charging multiple receivers using microwave multi-focusing. The wireless power transmission method performed by a power transmitter includes determining angular coordinates of the power transmitter in relation to a position of at least one power receiver; determining a distance between the at least one power receiver and the power transmitter based on the determined angular coordinates by using a focused microwave field; determining a location of the at least one power receiver based on the determined angular coordinates and the distance; and wire-
(Continued)

lessly transmitting power by focusing the microwave field to the determined location of the at least one power receiver.

20 Claims, 10 Drawing Sheets

(51) Int. Cl.
| | |
|---|---|
| *H02J 50/23* | (2016.01) |
| *H01Q 13/10* | (2006.01) |
| *H01Q 9/04* | (2006.01) |
| *H02J 50/90* | (2016.01) |
| *H01Q 1/50* | (2006.01) |
| *H01Q 3/26* | (2006.01) |
| *H01Q 3/28* | (2006.01) |
| *H01Q 3/30* | (2006.01) |
| *H05K 1/14* | (2006.01) |
| *H02J 50/40* | (2016.01) |

(52) U.S. Cl.
CPC ............... *H01Q 3/30* (2013.01); *H01Q 9/04* (2013.01); *H01Q 9/0428* (2013.01); *H01Q 9/0457* (2013.01); *H01Q 13/106* (2013.01); *H02J 50/90* (2016.02); *H02J 50/40* (2016.02); *H05K 1/144* (2013.01); *H05K 2201/042* (2013.01); *H05K 2201/043* (2013.01)

(58) Field of Classification Search
CPC .... H02J 7/00036; B60L 11/182; H01F 38/14; H01Q 13/106; H01Q 1/50; H01Q 3/2605; H01Q 9/04
USPC ................ 320/107, 108, 137, 142; 307/104; 342/359, 118, 147, 175
See application file for complete search history.

(56) References Cited

U.S. PATENT DOCUMENTS

| | | | |
|---|---|---|---|
| 6,967,462 B1 | 11/2005 | Landis | |
| 8,159,364 B2 | 4/2012 | Zeine | |
| 8,410,953 B2 | 4/2013 | Zeine | |
| 8,446,248 B2 | 5/2013 | Zeine | |
| 8,558,661 B2 | 10/2013 | Zeine | |
| 8,854,176 B2 | 10/2014 | Zeine | |
| 9,124,125 B2 | 9/2015 | Leabman et al. | |
| 9,130,397 B2 | 9/2015 | Leabman et al. | |
| 9,142,973 B2 | 9/2015 | Zeine | |
| 9,685,826 B1* | 6/2017 | Bhatti | H02J 50/23 |
| 9,900,057 B2 | 2/2018 | Leabman et al. | |
| 10,763,704 B2* | 9/2020 | Vilenskiy | H01Q 1/50 |
| 2009/0315412 A1 | 12/2009 | Yamamoto et al. | |
| 2010/0315045 A1 | 12/2010 | Zeine | |
| 2010/0327068 A1 | 12/2010 | Chen et al. | |
| 2011/0286374 A1 | 11/2011 | Shin et al. | |
| 2012/0126631 A1 | 5/2012 | Amma et al. | |
| 2013/0082653 A1 | 4/2013 | Lee et al. | |
| 2013/0135084 A1 | 5/2013 | Chakravarty et al. | |
| 2014/0375261 A1 | 12/2014 | Manova-Elssibony et al. | |
| 2016/0099614 A1 | 4/2016 | Leabman et al. | |
| 2016/0099757 A1 | 4/2016 | Leabman et al. | |
| 2020/0195057 A1* | 6/2020 | Greason | H01Q 3/30 |

FOREIGN PATENT DOCUMENTS

| | | |
|---|---|---|
| CN | 205622336 U | 10/2016 |
| KR | 10-2011-0127806 A | 11/2011 |
| RU | 2596604 C2 | 9/2016 |
| WO | 2008027650 A2 | 3/2008 |
| WO | 2013114378 A1 | 8/2013 |
| WO | 2014075103 A1 | 5/2014 |
| WO | 2016109316 A1 | 7/2016 |

OTHER PUBLICATIONS

International Search Report and Written Opinion regarding International Application No. PCT/KR2017/013952, dated Mar. 9, 2018, 14 pages.
Communication pursuant to Rule 164(1) EPC in connection with European Application No. EP17880394.6 dated Oct. 7, 2019, 13 pages.
Supplementary European Search Report in connection with European Application No. 17880394.6 dated Jan. 7, 2020, 14 pages.
The First Office Action in connection with Chinese Application No. 201780076204.5 dated Jul. 27, 2020, 20 pages.

* cited by examiner

MICROWAVE WIRELESS CHARGER WITH FOCUSING OF MICROWAVE FIELD

CROSS-REFERENCE TO RELATED APPLICATIONS

This application is a continuation of application Ser. No. 15/833,957, filed Dec. 6, 2017, which claims priority to Russian Patent Application RU 2016149071, filed Dec. 14, 2016, the disclosures of which are incorporated herein by reference.

BACKGROUND

1. Field

The present disclosure relates to an apparatus for wirelessly charging batteries of portable electronic devices, and more particularly, to a transmitter for determining the number and positions of power receivers for receiving wireless power and transmitting the wireless power to the power receivers.

2. Description of Related Art

The number of portable electronic devices is ever increasing these days.

The electronic devices are typically powered from an external power supply via wired connection. However, it is not practical for the user to always receive power through the wired connection. Since various electronic devices have different power requirements, most of the electronic devices are provided with their own dedicated power supplies. As a result, there exist various kinds of numerous power supplies dedicated to the respective electronic devices.

In the meantime, many portable electronic devices are powered by batteries. Frequent use of the portable electronic devices often makes the batteries easily depleted. However, the use of the batteries will avoid the need for a wired connection to a power supply during the use of the electronic device. Again, however, since the batteries lose their power from the use of the devices, they will need recharging (or replacing). To provide a significantly improved user experience, a power supply for wirelessly supplying power to electronic devices by means of microwaves has been proposed. The microwave power transmission enables wireless power transfer to the electronic devices without requiring any wired connection.

The efficiency of wireless power transmission depends on sizes of the power receiver (RX) and transmitter (TX) and a distance between the RX and the TX. Transmitted microwaves considerably diverge with increasing distance between the TX and the RX. The divergence rate of microwaves is determined by relations between transmitting aperture size, distance, and operating wavelength. To approximately estimate the achievable efficiency, an RX antenna aperture is denoted as DRX, and DTX denotes an equivalent TX aperture size recalculated for the receiver position. The equivalent aperture DTX is determined in such a way to include the main power flux emanating from a TX antenna. The efficiency η of power transmission is proportional to ratio of the square of RX antenna aperture to the square of equivalent TX antenna aperture ($\eta \sim D_{ax}^2/D_{TX}^2$). FIGS. 1A and 1B show comparison of power transmission efficiency depending on the distance between TX and RX antennas, the TX antenna being small. Specifically, FIG. 1A shows high efficiency at a short distance between the TX and RX antennas, and FIG. 1B shows low efficiency at a long distance between the TX and RX antennas. More specifically, when the TX antenna is small, the efficiency η of power transmission is high as the distance between the TX and RX antennas becomes short. However, as the distance between the TX and RX antennas increases, the efficiency η of power transmission drops very fast because of intense field divergence.

On the other hand, for a large TX antenna as shown in FIG. 1C, field divergence is lower than that of the small antenna shown in FIGS. 1A and 1B. Accordingly, with the large TX antenna, the efficiency η of power transmission drops slowly as the distance between the TX and RX antennas increases. It stays on a moderate level even when TX and RX antennas are close to each other (see FIG. 1C). Assessment of the efficiency η of power transmission is based on assumption of divergent electromagnetic waves. As shown in FIGS. 1A through 1C, by providing radiating waves converging from TX to RX, the received power and thus the efficiency η may be sufficiently increased. This effect is referred to as electromagnetic waves focusing phenomena, and may be employed in microwave wireless charging systems.

For effective power transmission from TX to RX antennas, TX system can be provided with information about an RX antenna position relative to TX antenna. One method to obtain this information is to elaborate preliminary RX search by TX system providing a narrow beam of radiated electromagnetic power. If a TX implements beam steering for a nearby RX, there is no difference in received power, because for different scanning angles (e.g., FIGS. 2A and 2B) the receiver absorbs the same rate of microwave power. The TX selects an angle for the maximum received power and scans to find an angular position of the RX, and during the scanning, the RX sends feedback information about the received power. For the most effective power transmission control, the TX system can determine a precise location of the RX based on the feedback information from the RX. However, the received power of the RX is not different for a different scanning angle, it is impossible to determine a precise location of the RX.

Accordingly, at present, the field of wireless power transmission is actively being developed and there are many solutions disclosing different aspects of the issues.

Taking a close look at one of the solutions, a system for providing wireless charging and/or primary power for electronic/electric devices through microwave energy, the microwave energy is focused to a location by a power transmitter having one or more adaptively-phased microwave array emitters. Rectennas within a device to be charged receive and rectify the microwave energy and use it for battery charging and/or for primary power. However, a transmitting unit can have many transceiver modules to operate both in transmitting and receiving modes to detect a receiver unit. During the latter mode, the transmitting unit can operate to detect a phase of a received signal at every element of the antenna array. Moreover, the aforementioned TX design assumes that the system can be able to maintain a single transmitting array element operation mode. The TX architecture is rather complex and can have at least two times more hardware elements than a single-mode transmitting unit. Also, how to simultaneously charge several receiving units may not be provided.

Another power system suggests a TX that transmits a power transmission signal (e.g., microwave signal waves) to create a three-dimensional pocket of energy. At least one RX may be connected to or integrated into electronic devices and may receive power from the pocket of energy. The TX may locate the at least one RX in a three-dimensional space using a communication medium (e.g., Bluetooth technology). The TX generates a waveform to create a pocket of energy around each of the at least one RX. The TX uses an algorithm to direct, focus, and control the waveform in three dimensions. The RX may convert the transmission signals (e.g., microwave signals) into electricity for powering an electronic device. Accordingly, the embodiments for wireless power transmission may allow powering and charging a plurality of electrical devices without wires. However, a search procedure for determining locations of power receivers in relation to the power transmitter is very long and not optimal, as it is based on iterative sorting of all phase states for each TX antenna element. Furthermore, multi-receiver charging can have TX antenna separation on several arrays, which leads to low efficiency of power transmission.

SUMMARY

To address the above-discussed deficiencies, it is an object to provide a transmitter and transmitting method for providing focusing of field at positions of receivers.

The present disclosure also provides a transmitter and transmitting method for implementing a rational (smart) search procedure in relation to locations of receivers.

The present disclosure also provides a transmitter and transmitting method for simultaneously charging multiple receivers with maximum efficiency.

The present disclosure also provides a transmitter and transmitting method for simply and precisely determining the location of a receiver for control of maximum efficient power transmission.

The present disclosure also provides a transmitter and transmitting method allowing microwave multi-focusing for simultaneously charging multiple receivers.

In accordance with an aspect of the present disclosure, the wireless power transmission method performed by a power transmitter is provided. The wireless power transmission method includes determining angular coordinates of the power transmitter in relation to a position of at least one power receiver; determining a distance between the at least one power receiver and the power transmitter based on the determined angular coordinates by using a focused microwave field; determining a location of the at least one power receiver based on the determined angular coordinates and the distance; and wirelessly transmitting power by focusing the microwave field to the determined location of the at least one power receiver, wherein, if there are multiple power receivers, the wirelessly transmitting of power comprises simultaneously charging the multiple power receivers by multi-focusing a microwave field to determined receiver locations of the multiple power receivers.

In accordance with another aspect of the present disclosure, a power transmitter for performing wireless power transmission is provided. The power transmitter includes at least one power transmitter antenna array for generating a microwave field; and a controller for determining angular coordinates of the power transmitter in relation to a position of at least one power receiver, determining a distance between the at least one power receiver and the power transmitter based on the determined angular coordinates, determining a location of the at least one power receiver based on the determined angular coordinates and the distance, and wirelessly transmitting power by focusing the microwave field to the determined location of the at least one power receiver, wherein, if there are multiple power receivers, the controller simultaneously charges the multiple power receivers by multi-focusing a microwave field to locations of the multiple power receivers.

In accordance with another aspect of the present disclosure, a transmitter antenna array for generating a microwave field is provided. The transmitter antenna array includes a first printed circuit board (PCB) and a second PCB, which are stacked without electric connection, wherein the first PCB carries microwave input, power dividing circuitry, phase shifters, microstrip or coplanar array element excitation circuitry on the first side, and coupling slot aperture on the second side, and wherein the second PCB carries circularly polarized patch excited by the slot aperture coupled to microstrip or coplanar excitation circuitry, and wherein the first PCB comprises a double-sided, low-loss, high frequency PCB, and the second PCB comprises a single-sided PCB.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 3 through 10B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

In order to perform wireless power transmission, it is necessary first to determine the number and locations of power receivers.

Figure 1A:
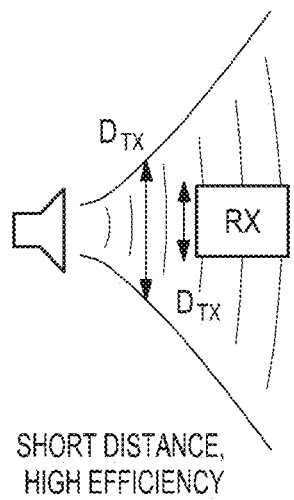
FIGS. 1A and 1B are schematic diagrams of two different types of magnetic field divergence of a small antenna.
Figure 1B:
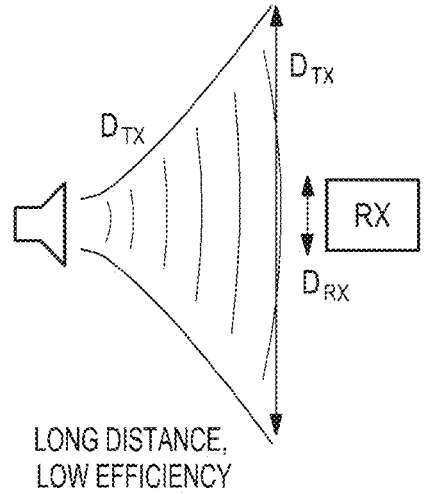
Figure 1C:
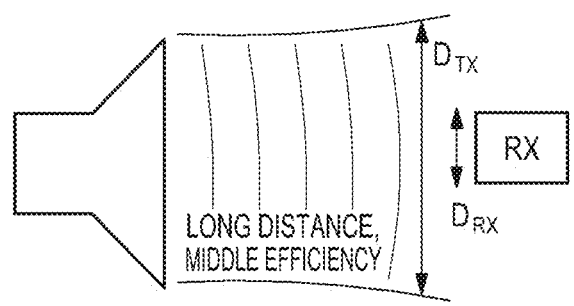
FIG. 1C is a schematic diagram of magnetic field divergence of a large antenna.
Figures 2A, 2B:
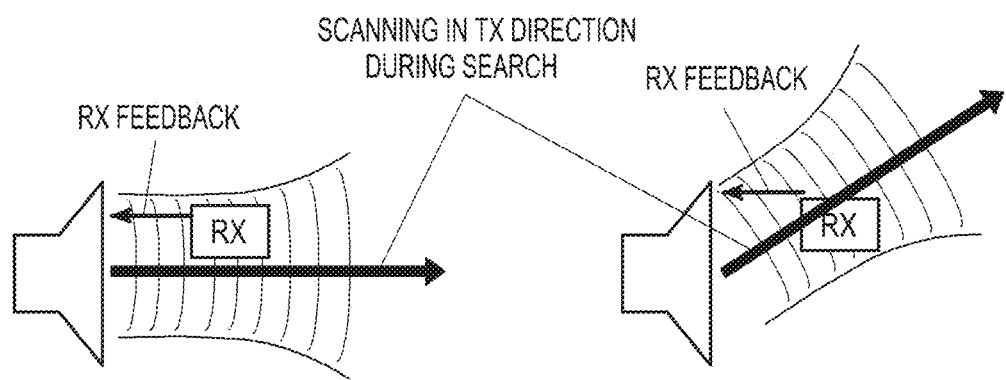
FIGS. 2A and 2B are schematic diagrams of two different scanning angles during beam steering for determining a receiver location.
Figure 3:
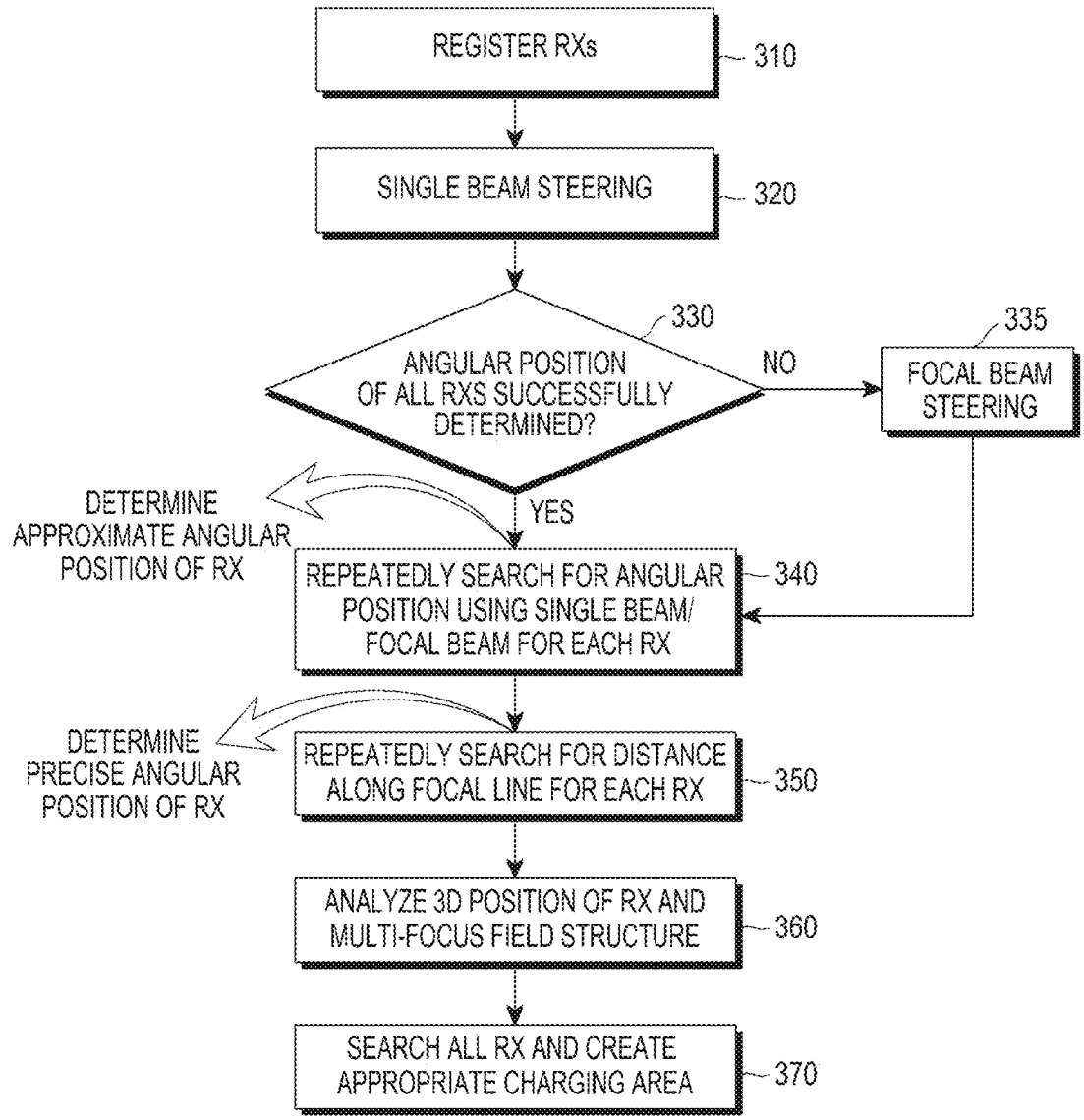
FIG. 3 is a flowchart illustrating a wireless charging method, according to an embodiment of the present disclosure.

FIG. 3 is a flowchart illustrating a wireless charging method, according to an embodiment of the present disclosure.

Referring to FIG. 3, a procedure of determination of the location of a receiver in accordance with the present disclosure will now be described in detail.

A transmitter (TX) registers receivers (RXs), in 310. The TX then performs beam steering for the registered device using a single beam, in 320. Subsequently, the TX determines if rough angular coordinates or angular positions of all the RXs are successfully determined, in 330. If the rough angular positions (angular coordinates) of all the RXs are successfully determined, the TX repeatedly performs angular search for each RX using a single beam/focal beam, in 340. Otherwise, if the determination of the angular positions (angular coordinates) of the RXs is not successful, focal beam steering is performed for an RX for which the angular positioning is not successful, in 335. Afterward, the TX repeatedly does angular searches using the single beam/focal beam to have the angular positions (angular coordinates) of all the RXs precisely searched for. Once the correct angular positions (angular coordinates) of all the RXs are searched for, the TX repeatedly searches for a distance to each RX along a focal line. This distance search is performed repeatedly.

Once the angular positions (angular coordinates) and distances for all the RXs are determined, the TX determines precise three dimensional (3D) positions of all the RXs, in 350. Subsequently, the TX performs 3D position analysis and multi focal field structure analysis, in 360. All the registered RXs are searched, and an appropriate charging area is formed, in 370. In this regard, the TX is a power TX for power transmission, and the RXs are power RXs for power reception. A method for locating RXs will be described as follows:

Stage 1: beam steering in ($\theta$ (elevation angle), $\varphi$ (azimuth angle)) space.

A transmitting antenna array implements panoramic beam steering to detect all RXs' positions. The transmitting antenna forms a single beam of given shape, and all measured RXs' powers sent by feedback signals are recorded in a TX's memory.

If a distance R between TX and RX is R>DTX (real transmitting array aperture linear size), the TX may detect an approximate receiver's angular position ($\theta'_{RX}$, $\varphi'_{RX}$) by picking an angular point with maximal receiver voltage.

If, during the beam steering stage, a TX controller fails to detect that, for a particular angle, there is a maximal output power at receiver output (no output sharp extremum), then the TX controller determines that R≤DTX. This means that then angular position detection may not be done uniquely by the single beam steering and the power controller can switch the transmitting system into a focal beam steering regime.

Figure 4A:
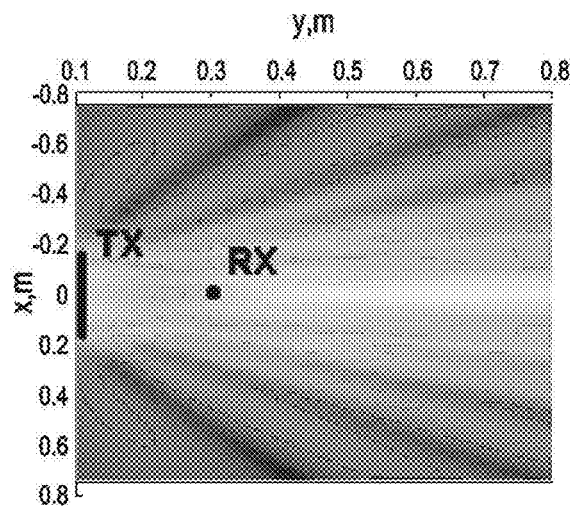
FIGS. 4A and 4B are images of two different types of a longitudinal cut of the distribution of a three dimensional (3D) electric field generated by a transmit array.
Figure 4B:
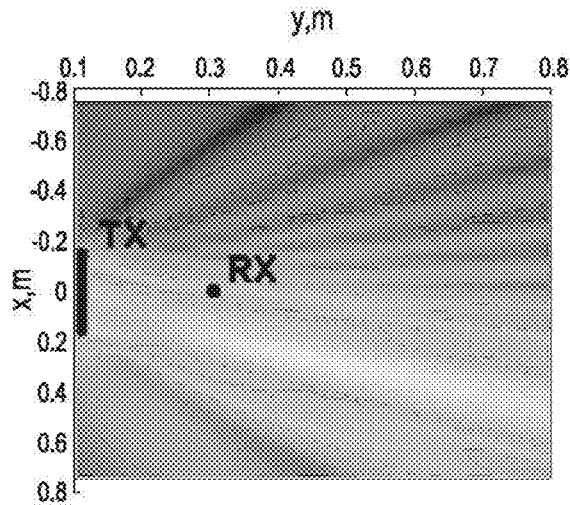

FIGS. 4A and 4B depict two different types of a longitudinal cut of 3D electric field distribution generated by about 30×30 cm2 transmitting array in a beam steering regime (regime 1) according to the present disclosure. The RX is at a distance of about 30 cm from the TX. In this regime, the RX has the same output power for many steering angles. Accordingly, it is impossible to detect a precise angular position at which to receive maximum output power.

During the beam steering regime, the TX antenna array is excited in the following manner.

Let k be the index of transmitting antenna array element, then the complex excitation coefficient Ak of the k-th element may be computed as follows:

$$A_k = \exp(i\psi_k), \quad (1)$$

where i is an imaginary unit, and $\psi_k$ is a k-th element phase for beam steering:

$$\psi_k = -\frac{2\pi}{\lambda}\sin(\theta)(x_k\cos(\varphi) + y_k\sin(\varphi)), \quad (2)$$

where $\lambda$ is a wavelength of a charging field; $\theta$ and $\varphi$ are current elevation and azimuth angles in the spherical coordinate system related to the TX array center; $x_k$ and $y_k$ are Cartesian coordinates of k-th TX array element in the array plane.

Excitation amplitude ($M_k$) and phase ($\varphi_k$) of k-th transmitting antenna array element may be determined as:

$$M_k = \text{mag}(A_k), \varphi_k = \text{phase}(A_k), \quad (3)$$

where operators «mag» and «phase» are used for obtaining amplitude and phase of a complex number, respectively.

Figure 4C:
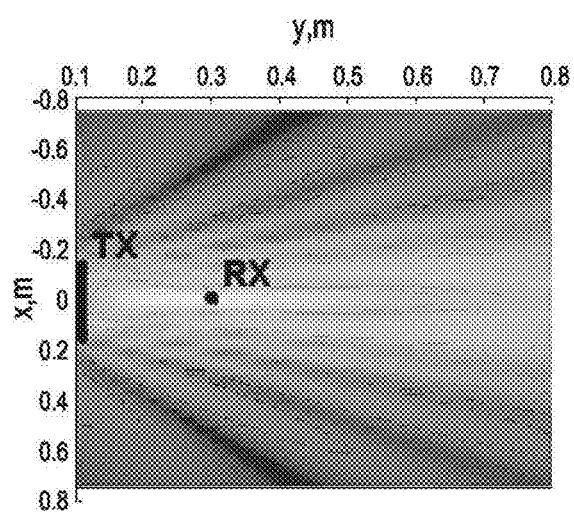
FIGS. 4C and 4D are images of two different types of a longitudinal cut of the distribution of a 3D electric field in a focal beam steering regime, according to an embodiment of the present disclosure.
Figure 4D:
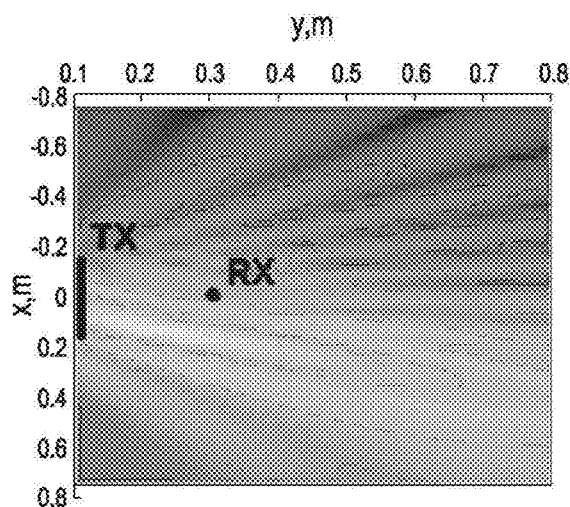

FIGS. 4C and 4D depict two different types of a longitudinal cut of a 3D electric field distribution generated by 30×30 cm² transmitting array in a focal beam steering regime (regime 2), according to the present disclosure. In this regime, the TX radiates a focal beam. The focal beam may be generated by point focusing at (0.8-1.2)$D_{TX}$ distance from the transmitting aperture or using Bessel beam technique. In this case, the TX may successfully detect approximate receiver's angular position for R≤$D_{TX}$. But for R>$D_{TX}$, a single beam steering can be used.

During the focal beam steering regime, the TX antenna array is excited in the following manner.

Let k be the index of transmitting antenna array element, then the complex excitation coefficient $A_k$ of the k-th element may be computed as follows:

$$A_k = \exp(i\psi_k), \quad (4)$$

where i is an imaginary unit, $\psi_k$ is phase delay of electromagnetic waves propagation between the k-th element and a focal point:

$$\psi_k = \frac{2\pi}{\lambda} R_k^{FB}, \quad (5)$$

where $\lambda$ is a wavelength of charging field, $R_k^{FB}$ is a distance between k-th element and focal point. The focal point is chosen at ~(0.8-1.2)$D_{TX}$ from the TX array aperture center for current θ and φ angles.

Excitation amplitude ($M_k$) and phase ($\varphi_k$) of k-th transmitting antenna array element may be determined as:

$$M_k = \text{mag}(A_k), \varphi_k = \text{phase}(A_k), \quad (6)$$

where operators «mag» and «phase» are used for obtaining amplitude and phase of a complex number, respectively.

Stage 2: iterative angular search in (θ, φ) space.

After the Stage 1, the TX performs an iterative angular search for each RX successively by implementing beam steering or focal beam steering depending on how the particular receiver's position was classified in the Stage 1. Iterative search for each RX is started from ($\theta'_{RX}$, $\varphi'_{RX}$) point and is based on one of iterative optimization procedures. For example, conjugated gradient optimization with a maximal output receiver power as a goal may be used.

As a result of stage 2, precise angular positions of all receivers ($\theta_{RX}$, $\varphi_{RX}$) are obtained.

Stage 3: iterative distance search in R space.

After all RXs' angular positions were determined during the Stages 1 and 2, the TX performs an iterative distance search to find the distance (R) from a transmitting array center to the RX position along the direction ($\theta_{RX}$, $\varphi_{RX}$) for each receiver successively. To implement the distance search, the TX performs point focusing starting from some preset distance. A distance search algorithm is based on one of iterative optimization procedures with a maximal output RX power as a goal.

During point focusing along determined angular position, TX antenna array is excited in the following manner.

Let k be the index of transmitting antenna array element, then the complex excitation coefficient $A_k$ of the k-th element may be computed as follows:

$$A_k = \exp(i\psi_k), \quad (7)$$

where i is an imaginary unit, $\psi_k$ is phase delay of electromagnetic waves propagation between the k-th element and a focal point:

$$\psi_k = \frac{2\pi}{\lambda} R_k^{PF}, \quad (8)$$

where $\lambda$ is a wavelength of charging field; $R_k^{PF}$ is a distance between k-th element and focal point. Focal point is chosen along θ and φ angles found for each RX after the search stages 1 and 2.

Excitation amplitude ($M_k$) and phase ($\psi_k$) of k-th transmitting antenna array element may be determined as:

$$M_k = \text{mag}(A_k), \varphi_k = \text{phase}(A_k), \quad (9)$$

where operators «mag» and «phase» are used for obtaining amplitude and phase of a complex number, respectively.

As a result of stage 3, precise angular positions for the entire 3D positions of all RXs ($\theta_{RX}$, $\theta_{RX}$, R) are obtained, in 360. 3D position analysis and multi focal field structure analysis for RXs are also performed, in 360. Subsequently, an optimal charging field for all the registered RXs is created.

Figure 10A:
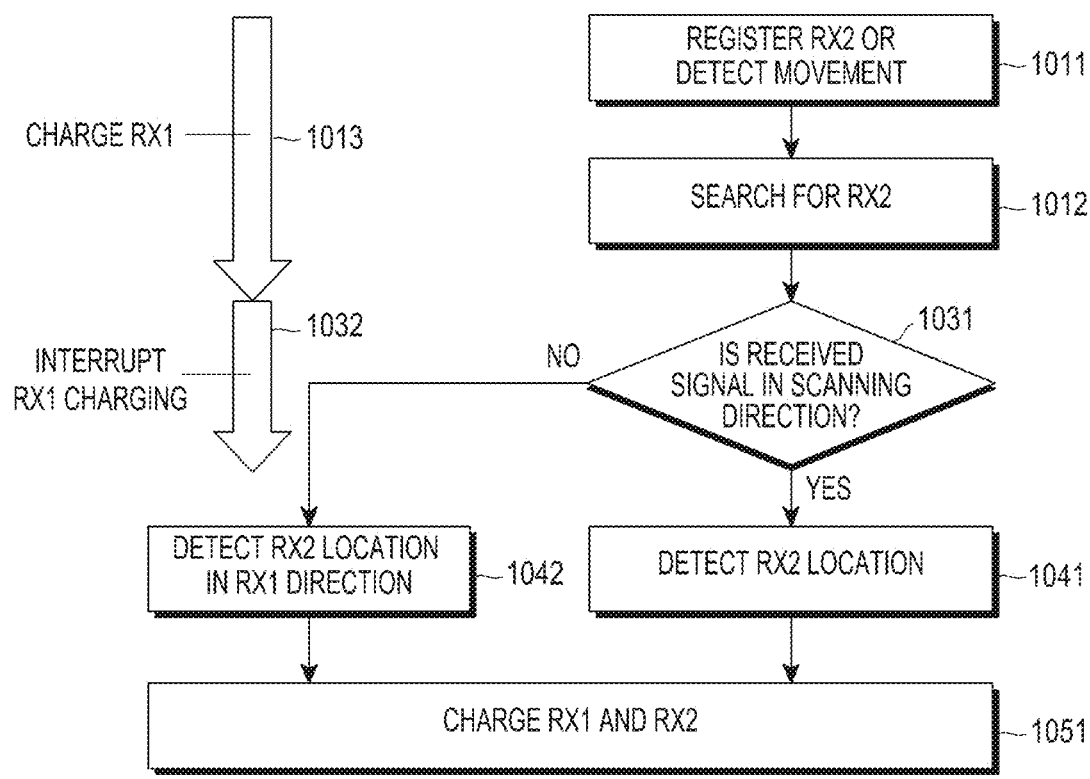
FIG. 10A is a flowchart illustrating operation of a power TX that searches for at least one second power RX while charging a first power RX, according to an embodiment of the present disclosure.
Figure 10B:
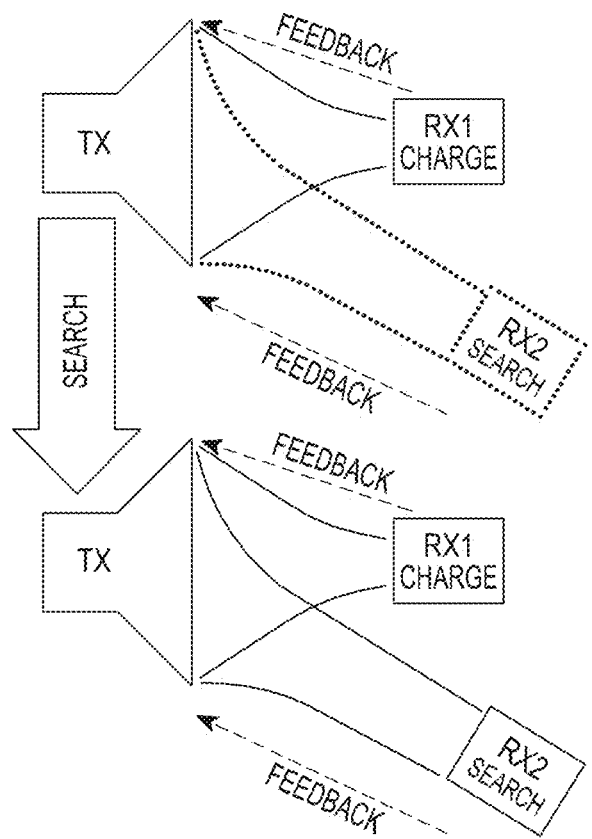
FIG. 10B shows the distribution of an electric field depending on the TX according to FIG. 10A.

FIG. 10A is a flowchart illustrating an operation of a TX searching for at least one second RX while charging a first RX, according to an embodiment of the present disclosure, and FIG. 10B shows the distribution of an electric field depending on the TX according to FIG. 10A.

Referring to FIGS. 10A and 10B, a procedure in which a TX searches for at least one other RX while charging an RX in accordance with the present disclosure will now be described.

While the TX is charging a first RX (RX1) in 1013, if the TX registers a second RX (RX2) or detects moving of the second RX (RX2), the TX searches for the second RX (RX2), in 1012. Detection of moving of the second RX (RX2) by the TX may be made by the second RX (RX2) sending information about the moving of the second RX (RX2) to the TX via a feedback channel. Such detection of moving of the second RX (RX2) may enable the TX to perform a search in a small area.

Meanwhile, if an RX notifies the TX of a low battery event through a feedback channel, the TX may form an electromagnetic field (EM field) to be able to distribute power for more receivers.

The TX determines whether the received signal depends on a scanning direction, in 1031. As shown in FIG. 10B, the TX searches for the second RX (RX2) in the direction of the first RX (RX1).

If it is determined that the received signal does not depend on the scanning direction, the TX interrupts the charging operation for the first RX (RX1) for a little while, in 1032. The TX then searches for a position of the second RX (RX2) in the direction of the first RX (RX1), in 1042. After searching for the position of the second RX (RX2), the TX charges the first and second RXs (RX1 and RX2), in 1051.

If the received signal depends on the scanning direction, the TX searches for the position of the second RX (RX2), and then charges the first and second RXs (RX1 and RX2), in 1051.

In accordance with the present disclosure, the TX may successfully transmit power to two RXs at different distances from the TX but in the same direction from the TX, using a multi focus algorithm. This is because the multi focal area is wider than the single focal area, so the shadowing effect is not heavy.

For example, consider the power efficiency in a case where the first and second RXs (RX1 and RX2) are located in the same direction from the TX but at distances of 40 cm and 70 cm, respectively, away from the TX.

During power transmission using multi focusing, measurements at the first and second RXs (RX1 and RX2) are field intensities of −0.55 dB and −4.5 dB, respectively. By comparison, during power transmission using single focusing, measurements at the first and second RXs (RX1 and RX2) are field intensities of −0.85 dB and −6.0 dB, respectively. That is, comparing the power transmission efficiencies at the first and second RXs, it is seen that the multi focusing based power transmission method that obtains the measurement of −4.5 dB has higher power transmission efficiency than the single focusing based power transmission method that obtains the measurement of −6.0 dB.

Figure 5A:
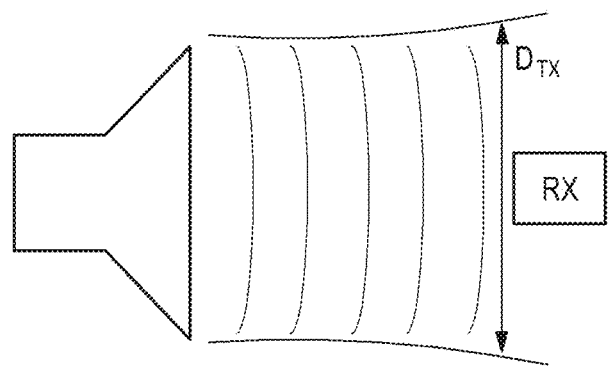
FIG. 5A shows a receiver (RX) field structure without focusing.
Figure 5B:
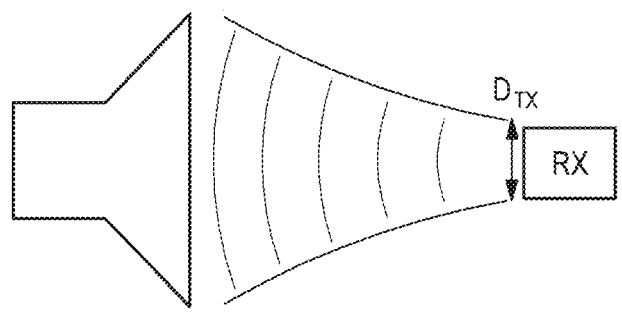
FIG. 5B shows an RX field structure with focusing.

FIG. 5A shows an RX field structure without focusing, and FIG. 5B shows an RX field structure with focusing. FIG. 5B shows advantages of using field focusing on the RX (FIG. 5B) during determination of RX location and power transmission, in comparison with the case where no focusing is performed (FIG. 5A). FIG. 5B shows near-field electromagnetic (EM) field focusing by the TX antenna on the RX position. In this case, the received power in FIG. 5B shows the case where the field focusing is increased drastically compared with the received power in FIG. 5A showing the case where no focusing is performed. Thus, using near-field focusing, one may determine the RX position in an accurate manner and ensure high efficiency of wireless power transmission.

Proposed search procedure timing may be estimated by assessment in a number of steps to find a position of power receiver.

The number of scan points according to straightforward (basic) search in 3D space is determined as in the following equation:

$$N_1 = N_\theta * N_\varphi * N_R$$

where $N_\theta$ is the number of points in elevation scan range;
$N_\varphi$ is the number of points in azimuth scan range;
$N_R$ is the number of points in distance focusing range.

By comparison, a search method proposed in an embodiment of the present disclosure is determined as in the following equation: Proposed search $(\theta, \varphi)$-space+R-space;

$$N_2 = N_\theta * N_\varphi * N_R$$

As an example, the straightforward search and the proposed search in the present disclosure are compared as follows:

For $N_\theta = 16$, $N_\varphi = 16$, and $N_R = 10$, search points are calculated to be 16×16×10 according to the straightforward search, and thus up to 2560 points can be scanned. By contrast, according to the proposed scanning method, 16×16+10, i.e., at most 266 points need to be scanned. Accordingly, the search method according to the present disclosure improves the search speed 10 times faster than the straightforward search in 3D space. Depending on the RX position, it can use one or more additional number of steps for iterative RX position refinement.

When positions of all RXs are obtained, the TX may start power transmission.

When the TX operates to charge several RXs, the system may perform simultaneous charging. A known way to do this is an array splitting scheme. This technique is based on splitting the whole TX array into several sub-arrays and assigning to each sub-array its own RX for wireless power transmission. This scheme has, however, problems as follows:
inaccurate RX positions search by wide sub-array beams;
interference between sub-arrays beams/focuses can use initial phase adjustment of all sub-arrays, which takes additional time to optimize phase distribution;
low efficiency caused by not optimal TX phase distribution.

The simultaneous charging of multiple RXs proposed by the present disclosure is characterized by the following features:

1. After successive search of each RX, the full transmitting array is used to form multi-focus field pattern;

2. The TX generates specific amplitude and phase distribution along TX array aperture so that each TX antenna array element charges each RX;

3. "Focuses interference" problem arising while charging nearby RXs, is mitigated by forming a shaped single "wide" focus.

Figure 6A:
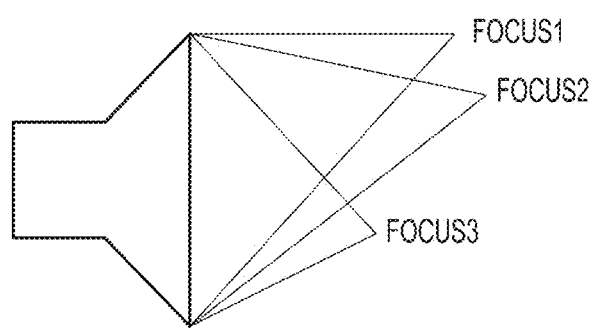
FIG. 6A shows a case where three power RXs are simultaneously charged by a single power transmitter (TX), according to an embodiment of the present disclosure.
Figure 6B:
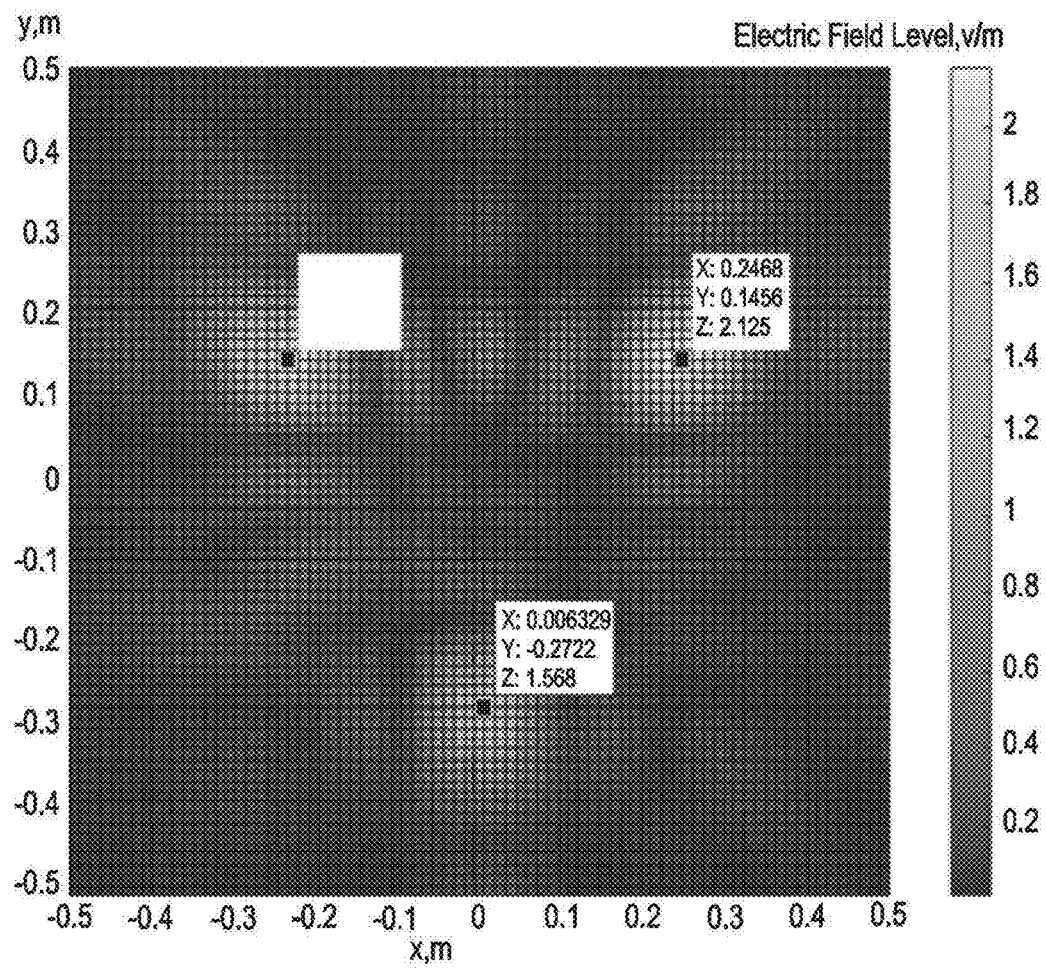
FIG. 6B shows a cross-cut of an exemplary transverse electric field.

FIG. 6A schematically shows simultaneous charging of three RXs by generation of three focal points, and FIG. 6B shows exemplary transverse electric field cross-cut at 0.5 m distance from 30×30 cm2 TX array that charges three RXs.

A TX antenna array needs to be excited by specific way to realize maximum power efficiency for simultaneous charging of several RXs.

Figure 7A:
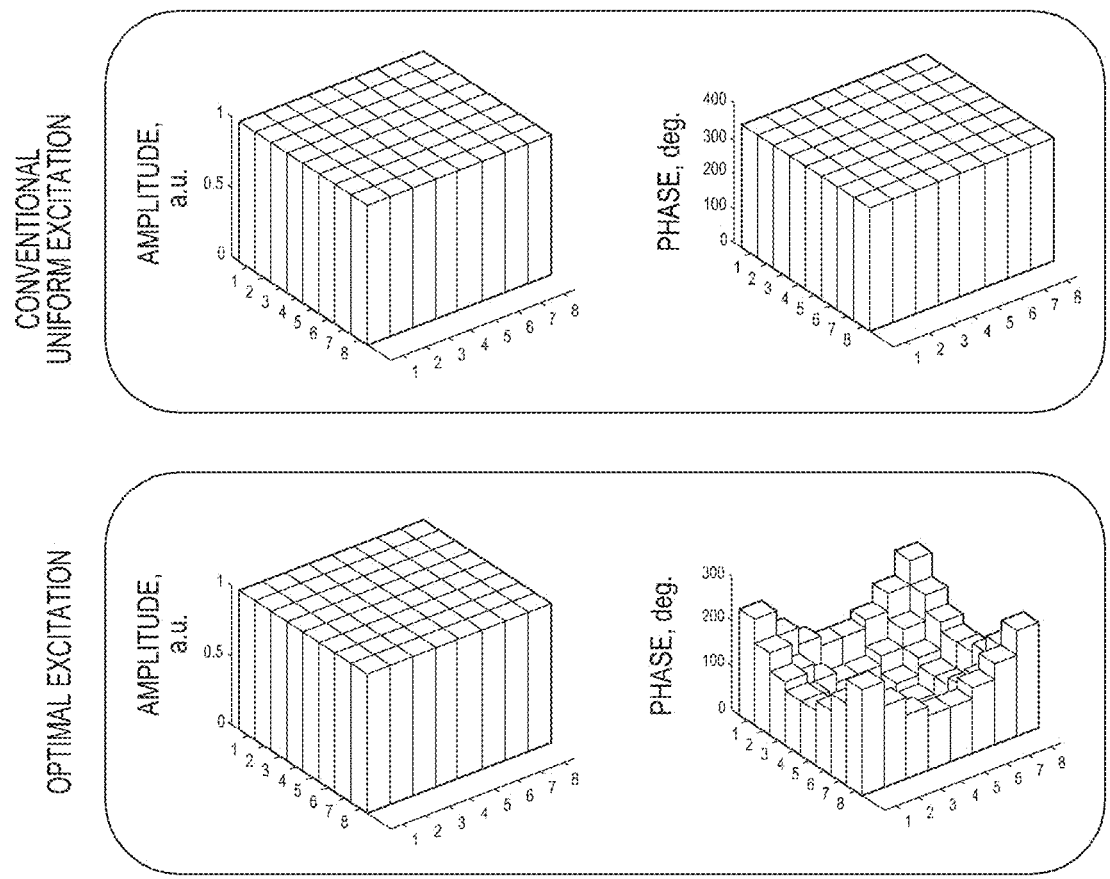
FIGS. 7A and 7B depict amplitude and phase distribution in a TX array for both optimal and uniform excitation, respectively, according to an embodiment of the present disclosure.
Figure 7B:
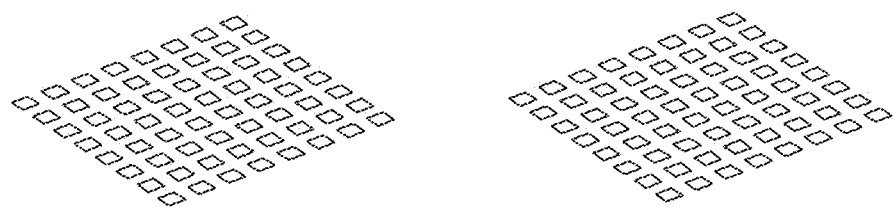

Exemplary amplitude and phase distributions of a TX array that charges a single RX are shown in FIGS. 7A and 7B, respectively, where diagrams for amplitude and phase distributions for conventional uniform antenna array excitation and for antenna array excitation according to the present disclosure are depicted. The proposed excitation method realizes a multi-focused charging field and employs known 3D positions of all receiving units determined during proposed 3-stage searching procedure.

Let k be the index of transmitting antenna array element, NRX is the number of RXs for charging, then the complex excitation coefficient $A_k$ of the k-th element may be computed as follows:

$$A_k = \Sigma_{j=1}^{NRX} C_j \exp(i\psi_{kj}), \tag{10}$$

where $C_j$ is a weighting coefficient, i is an imaginary unit, and $\psi_{kj}$ is phase delay of electromagnetic waves propagation between the k-th element and the j-th RX:

$$\psi_{kj} = \frac{2\pi}{\lambda} R_{kj}, \tag{11}$$

In equation (11), $\lambda$ is a wavelength of charging field, and $R_{kj}$ is a distance between the k-th element and the j-th RX. After calculating equation (10), excitation amplitude ($M_k$) and phase ($\varphi_k$) of k-th transmitting antenna array element may be determined as:

$$M_k = \mathrm{mag}(A_k), \varphi_k = \mathrm{phase}(A_k), \tag{12}$$

where operators «mag» and «phase» are used for obtaining amplitude and phase of a complex number, respectively.

In the simplest case, when the transmitting array has only phase shifters, the amplitude is set fixed (uniform over the array), and only the phase from equation (12) is used for multi-focusing realization. In this case, complex coefficients $C_j$ in equation (1) are employed to correct multi-focus field pattern and to compensate for some field distribution errors caused by amplitude equalization.

In the case when both excitation amplitude and phase may be controlled, equation (12) is used for setting array's controllable attenuators and phase shifters, while coefficients $C_j$ may be used to emphasize the majority of j-th RX by sending to it the higher relative power level.

According to one embodiment, the present disclosure provides for the charging of moving portable devices.

The RX may send a client number, a logical request for charging, and information about measured voltage at an RX rectifier to the TX via a feedback channel.

The RX may further send information about a battery level, information about preferred input power, and information about a relative displacement for fast beam-focus adjustment via the feedback channel.

The RX sends information about the start of moving over the feedback channel. The TX starts a search procedure in a small area around the RX according to the aforementioned technique. If the RX has movement data (like velocity or position data), the TX may process it and search into a smaller region.

Further, according to another embodiment of the present disclosure, the RX sends information about low battery event over the feedback channel. The TX forms a microwave field distribution with more power in one of focuses/beams. It is possible as for phase control only as for amplitude-phase control over TX antenna.

If, for example, two RXs are located in the same direction but at different distances from the TX, a general multi-focus algorithm will successfully deliver power to the two RXs. That is, it has a better efficiency compared to the single beam generation. When the focal area is very narrow in real wireless power transmission scenario, the first RX (RX1) located near the TX will shadow the second RX (RX2) located far from the TX. Therefore, power transmission efficiency will drop for the second RX (RX2). The present disclosure allows generating of a wider focal area, so the shadowing effect is not so heavy.

According to another aspect of the present disclosure, the system for performing the aforementioned wireless power transmission method is proposed. The proposed system is comprised of a power TX and at least one power RX. The power TX includes a TX antenna array for generating a microwave field. The microwave is also called ultrahigh frequency waves or ultra short waves. The TX antenna array is configured to form microwave field focal points/lines. The at least one power receiver comprises a battery to be charged. According to one embodiment, the TX antenna array can be passive TX antenna array. According to another embodiment, the TX antenna array may be active TX antenna array. The proposed wireless power transmission system is capable of microwaves multi-focusing for simultaneous charging of a few power RXs.

According to another aspect of the present disclosure, a TX antenna array for using in the aforementioned wireless power transmission system is proposed. The TX antenna array is used for generating a microwave field according to the aforementioned techniques.

The TX antenna array structure is characterized by the following features:
two printed circuit boards (PCBs) are used: the first one is a two-sided low-loss high frequency substrate, and the second one is a single-sided substrate without special requirements for its microwave performance (FR4 substrate, for example);

At least one serial divider allows compact placing of feeding circuitry together with active electronics (phase shifters, amplifiers, attenuators, etc.) on the first PCB;

Slot excitation of antenna elements excludes any connectors between PCBs.

Figure 8:
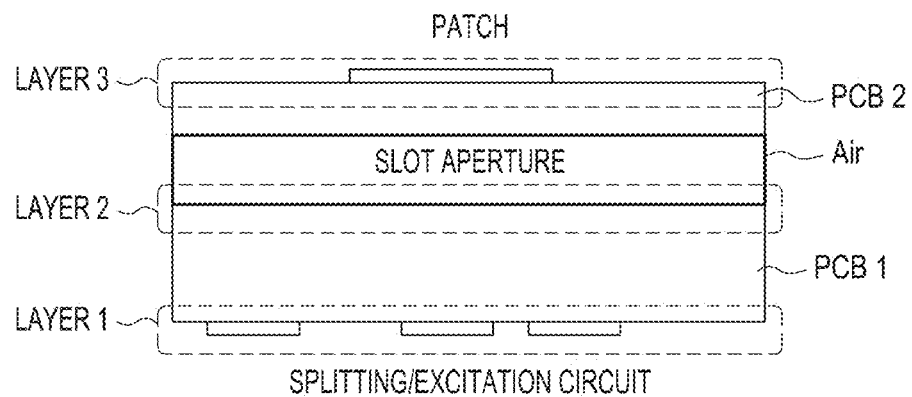
FIG. 8 is a cross-sectional view of an exemplary antenna array element structure, according to an embodiment of the present disclosure.

A cross-section of an exemplary antenna array element structure according to the present disclosure is shown in FIG. 8.

The antenna array in accordance with the present disclosure is comprised of two PCBs: the first one is a two-sided low-loss high frequency substrate, and the second one is a single-sided substrate without special requirements for its microwave performance. The two PCBs are connected with a dielectric layer or an air gap with spacers. The proposed design does not require any galvanic connections between the two PCBs. Therefore, the array manufacturing and assembling processes are simplified because each PCB may be fabricated separately and assembled by straight connection using, for example, PCB spacers. This array structure has advantages of reduced costs, design flexibility, and high repeatability. The first PCB carries a microwave input connected to an antenna array feeding system realized, for example, using microstrips or coplanar transmission lines placed on layer 1 (FIG. 8). As the antenna array has a planar structure, its elements are placed to form some planar grid. Thus, the feeding system may include two sections, which are row and column power dividers. To reduce a space occupied by the feeding system on the first PCB, at least one of the power dividers is implemented with a serial architecture. Antenna array elements are formed as printed resonant patches on one side of the second PCB (layer 3, FIG. 8) and excited by a slot coupling with microstrip/coplanar excitation lines of the first PCB. A slot structure is formed in the ground layer of the first PCB (layer 2, FIG. 8). To adaptively control the transmitted microwave energy in space and time, e.g. to realize beam steering and focusing, the transmit antenna array can be equipped with at least phase shifter devices. The phase shifters are directly integrated between a power divider and an array element excitation circuitry in the same footprint of the first PCB (layer 1, FIG. 8). This allows the first PCB layout structure to have a very high level of components integration. For example, if the phase shifters are based on a controlled varactor or PIN diode surface mount device (SMD) elements, assembling of the first PCB may be implemented during the single SMD mounting process.

For further increase of radiation control capabilities, each array element may be equipped with a power amplifier and a controllable attenuator, which may be performed in the same first PCB footprint together with the phase shifters (layer 1, FIG. 8). In the other case, these components may have monolithic microwave integrated circuit (MMIC) configuration and may be directly mounted on the first PCB. The MIMIC refers to a high frequency integration circuit manufactured by a batch process on a single semiconductor substrate, which is a part capable of performing amplification of a weak signal, frequency conversion, etc. With the MMIC, the high frequency system may be light-weighted and miniaturized, and also the production yield may be increased by significantly reducing the number of parts for use. Since connections of not only active and passive devices but also unit devices on the semiconductor substrate are made in a batch process, the MIMIC is small, reliable, and has uniform property as compared with the conventional high frequency circuit board. Furthermore, the MIMIC does not need extra packages for individual parts, and thus reduce the manufacturing costs compared to manufacturing the high frequency circuit with individual parts.

An array element radiator uses circular polarity achieved by single slot excitation of a patch with a degraded symmetric form (e.g., a chamfered square patch).

The first PCB may also carry control and direct current (DC) feeding lines for active electronics, and may also include some digital control components.

Figure 9:
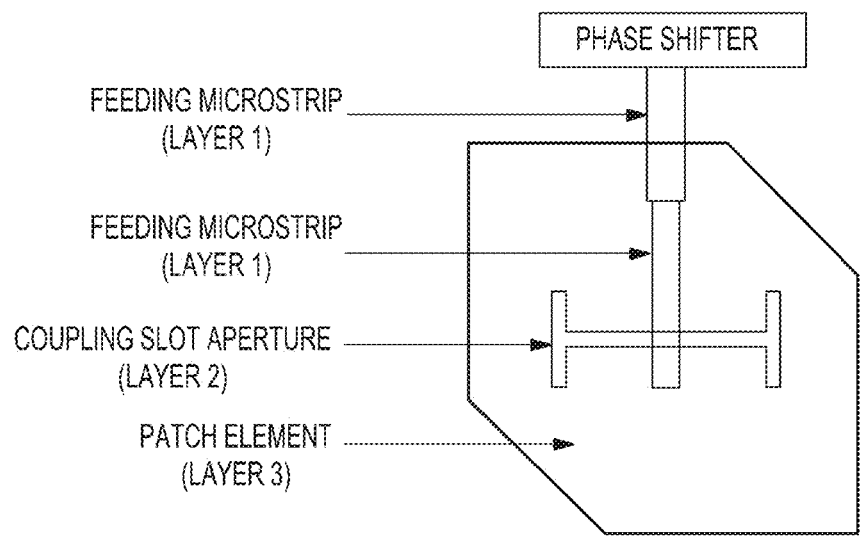
FIG. 9 is a top view of an exemplary patch element having slot excitation and feeding microstrip lines, according to an embodiment of the present disclosure.

A top view of an exemplary array element with microstrip excitation and H-slot coupling to a chamfered square patch is shown in FIG. 9 (phase shifter is not shown).

Thus, the present disclosure may attain the following advantages:

Fast receiver localization by a 3-stage search algorithm in 3D space;
Increased power transmission efficiency by focusing;
Multi-focus for simultaneous charging of a few power RXs;
Simple, compact and robust transmitter antenna array structure.

It should be noted that embodiments of the present disclosure can provide at least the following improvements for user experience:

a possibility of using for wireless powering of any kind of portable electronics (smartphones, tablets, watches etc.);
a possibility of simultaneous charging of a plurality of devices;
a possibility of charging of moving portable devices;
a quick connection between the TX and the RX, etc.

According to embodiments of the present disclosure, rational receiver search may be made in 3D space with switching between beam steering and focusing regimes. Also, multi-focusing may be used to simultaneously charge multiple receivers.

A transmitter according to embodiments of the present disclosure may search for a high-speed receiver in 3D space through a three-phase search algorithm.

The transmitter may increase power transmission efficiency through focusing.

The transmitter may simultaneously charge power receivers using multi-focusing.

All functions described in the specification may be controlled and performed by a controller or processor. The elements herein referred to in the singular do not exclude a plurality of elements, unless otherwise specified. Despite the fact that exemplary embodiments have been described in detail and shown in the accompanying drawings, it should be understood that these embodiments are merely illustrative and are not intended to limit the broader disclosure, and that the disclosure should not be limited to the specific illustrated and described arrangements and structures, since various other modifications may be obvious to those skilled in the art.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method of providing power by a transmitter, the method comprising:
    performing a beam steering using a focal beam focused on a specific point;
    identifying direction and elevation information for each of one or more receivers based on the beam steering;
    determining a focal point for each of the one or more receivers by focusing each of the one or more receivers using the focal beam based on the direction and elevation information for each of the one or more receivers;
    identifying distance information between an antenna array of the transmitter and the focal point for each of the one or more receivers;
    obtaining position information for each of the one or more receivers based on the direction and elevation information, and the distance information for each of the one or more receivers;
    generating a first microwave field with one or more different focuses by controlling a phase for each of antenna elements included in the antenna array based on the position information obtained for each of the one or more receivers; and
    providing one or more power signals emitted by the first microwave field to the one or more receivers.

2. The method of claim 1, wherein the direction and elevation information for each of the one or more receivers includes information about an elevation angle and an azimuth angle for each of the one or more receivers.

3. The method of claim 1, further comprising:
    detecting a receiver different from the one or more receivers while providing the one or more power signals to the one or more receivers;
    identifying position information for the receiver;
    generating a second microwave field with one or more different focuses by controlling the phase for each of the antenna elements based on the position information obtained for each of the one or more receivers and the position information identified for the receiver; and
    providing two or more power signals emitted by the second microwave field to the one or more receivers and the receiver.

4. The method of claim 3, wherein the identifying of the position information for the receiver comprises:
    identifying direction and elevation information for the receiver based on the beam steering;
    determining a focal point for the receiver by focusing the receiver using the focal beam based on the direction and elevation information for the receiver;
    identifying distance information between the antenna array and the focal point for the receiver; and
    obtaining the position information for the receiver based on the direction and elevation information for the receiver, and the distance information between the antenna array and the focal point for the receiver.

5. The method of claim 1, wherein the providing of the one or more power signals comprises simultaneously providing one or more power signals emitted by the first microwave field to the one or more receivers.

6. The method of claim 1, wherein an amount of power included in the one or more power signals is determined based on battery level information received from each of the one or more receivers.

7. The method of claim 1, wherein an amount of power included in the one or more power signals is determined based on preferred power information requested from each of the one or more receivers.

8. The method of claim 1, wherein a distance between the antenna array and the focal point for each of the one or more receivers is equal to or smaller than a transmitting aperture size of the antenna array.

9. The method of claim 1, further comprising:
    receiving a signal for focus adjustment from each of the one or more receivers; and adjusting the focal point determined for each of the one or more receivers, in response to the received signal.

10. The method of claim 1, wherein the one or more receivers are one or more receivers registered with the transmitter.

11. A transmitter, comprising:
an antenna array; and
at least one processor configured to:
perform a beam steering using a focal beam focused on a specific point,
identify direction and elevation information for each of one or more receivers based on the beam steering,
determine a focal point for each of the one or more receivers by focusing each of the one or more receivers using the focal beam based on the direction and elevation information for each of the one or more receivers,
identify distance information between the antenna array and the focal point for each of the one or more receivers,
obtain position information for each of the one or more receivers based on the direction and elevation information, and the distance information for each of the one or more receivers,
generate a first microwave field with one or more different focuses by controlling a phase for each of antenna elements included in the antenna array based on the position information obtained for each of the one or more receivers, and
provide one or more power signals emitted by the first microwave field to the one or more receivers.

12. The transmitter of claim 11, wherein the position information of each of the one or more receivers includes direction information of each of the one or more receivers from the antenna array.

13. The transmitter of claim 11, wherein the at least one processor is further configured to:
detect a receiver different from the one or more receivers while providing the one or more power signals to the one or more receivers,
identify position information for the receiver,
generate a second microwave field with one or more different focuses by controlling the phase for each of the antenna elements based on the position information obtained for each of the one or more receivers and the position information identified for the receiver, and
provide two or more power signals emitted by the second microwave field to the one or more receivers and the receiver.

14. The transmitter of claim 13, wherein the at least one processor is further configured to:
identify direction and elevation information for the receiver based on the beam steering,
determine a focal point for the receiver by focusing the receiver using the focal beam based on the direction and elevation information for the receiver,
identify distance information between the antenna array and the focal point for the receiver, and
obtain the position information for the receiver based on the direction and elevation information for the receiver, and the distance information between the antenna array and the focal point for the receiver.

15. The transmitter of claim 11, wherein the at least one processor is further configured to simultaneously provide one or more power signals emitted by the first microwave field to the one or more receivers.

16. The transmitter of claim 11, wherein an amount of power included in the one or more power signals is determined based on battery level information received from each of the one or more receivers.

17. The transmitter of claim 11, wherein an amount of power included in the one or more power signals is determined based on preferred power information requested from each of the one or more receivers.

18. The transmitter of claim 11, wherein a distance between the antenna array and the focal point for each of the one or more receivers is equal to or smaller than a transmitting aperture size of the antenna array.

19. The transmitter of claim 11, further comprising a transceiver coupled to the antenna array,
wherein the at least one processor is further configured to:
control the transceiver to receive a signal for focus adjustment from each of the one or more receivers, and
adjust the focal point determined for each of the one or more receivers, in response to the received signal.

20. The transmitter of claim 11, wherein the one or more receivers are one or more receivers registered with the transmitter.

* * * * *